United States Patent [19]
Lim

[11] Patent Number: 5,329,115
[45] Date of Patent: Jul. 12, 1994

[54] OPTICAL RECEIVER CIRCUIT

[75] Inventor: Peter Jean-Woo Lim, Mohegan Lake, N.Y.

[73] Assignee: International Business Machines Corporation, Armonk, N.Y.

[21] Appl. No.: 55,482

[22] Filed: Apr. 29, 1993

[51] Int. Cl.$^5$ .............................................. H01J 40/14
[52] U.S. Cl. ............................ 250/214 R; 250/214 A; 307/311; 330/59
[58] Field of Search ....... 250/214 R, 214 A, 214 DC, 250/214 LA; 307/311; 330/59

[56] References Cited
U.S. PATENT DOCUMENTS

| | | | |
|---|---|---|---|
| 4,498,001 | 2/1985 | Smoot | 250/214 A |
| 4,623,786 | 11/1986 | Rodwell | 250/214 A |
| 4,857,725 | 8/1989 | Goodnough et al. | 250/214 A |
| 5,013,903 | 5/1991 | Kasper | 250/214 A |
| 5,162,754 | 11/1992 | Soares et al. | 330/277 |

Primary Examiner—Davis L. Willis
Assistant Examiner—T. Davenport
Attorney, Agent, or Firm—Robert M. Trepp

[57] ABSTRACT

An optical receiver circuit for receiving optical signals is described incorporating a photodetector, two coupling capacitors for coupling each side of the photodetector to respective inputs of a transimpedance amplifier, two current mirror circuits for detecting current on each side of the coupling capacitor and injecting equivalent current to the other side of the other capacitor which is at the input of the transimpedance amplifier, two low pass filters, two current sources and a transimpedance amplifier having two inputs. An optical receiver for receiving optical signals is described incorporating a photodetector having one side coupled to a reference voltage, a current source, a coupling capacitor, a transimpedance amplifier, and a circuit for injecting AC current to the input of the amplifier from the voltage developed across the photodetector. The invention overcomes the problem of requiring large coupling capacitors in an optical receiver circuit to accommodate a low bandwidth due to a long string of 1's or 0's.

11 Claims, 4 Drawing Sheets

OPTICAL RECEIVER CIRCUIT

BACKGROUND OF THE INVENTION

1. Field of the Invention

This invention relates to an optical receiver circuit, and more particularly, to an electrical circuit which includes an AC coupling circuit and a differential transimpedance amplifier for generating a digital data stream from a radiant energy signal.

2. Description of the Prior Art

A typical high-speed optical receiver design uses a photodetector to convert the optical signal to a current signal. The current signal is coupled to the input of a transimpedance amplifier which converts the current signal to a voltage signal. One example of a transimpedance amplifier is described in U.S. Pat. No. 4,498,001 which issued on Feb. 5, 1985 to L. S. Smoot. The transimpedance amplifier of '001 has an increased dynamic range. A peak detector, at the output of an inverting amplifier, turns on a field effect transistor when an AC component of an electrical signal becomes so large that the inverting amplifier would otherwise go into saturation. The field effect transistor circuit acts as an AC shunt impedance at the input of the inverting amplifier and diverts the excess AC current to ground. In addition, sense and sink current mirrors effectively divert an excessive DC component of the electrical signal away from the input of the inverting amplifier. The optical sensitivity and performance of the optical receiver remains unchanged while the dynamic range of the transimpedance amplifier is increased.

AC coupling of a current signal to the input of a transimpedance amplifier is required where a small signal may have a varying or large DC component that must be subtracted from the current signal before it can be accurately amplified. AC coupling of a current signal is also required when a differential transimpedance amplifier is used. Further, AC coupling must be used when a large voltage bias is applied across the photodetector and the current signal is to be connected to the input of a differential amplifier.

Referring to FIG. 1, an optical receiver 10 of the prior art is shown comprising a photodetector 12, an AC coupling input stage 14 and a differential transimpedance amplifier 16. The DC bias voltage across photodetector 12 is removed by identical capacitors 17 and 18. The low cutoff frequency is determined by the RC time constant of resistor 19 and capacitor 17 and by resistor 20 and capacitor 18. Large values of resistors 19 and 20 and capacitors 17 and 18 are desired in order that a sufficiently low cutoff frequency is attained. However, in monolithic integration or in an integrated circuit chip, the coupling capacitance, i.e. capacitors 17 and 18, cannot be made very large due to area constraints on the integrated circuit chip and also due to the large parasitic capacitances associated with capacitors formed on integrated circuit chips. Large parasitic capacitances lower the bandwidth and also decrease the sensitivity of the amplifier arrangement. Large values of biasing resistances, resistors 19 and 20 are desired. To maintain a large value of resistors 19 and 20 while maintaining sufficient voltage bias across photodetector 12 for large input currents, current sources may be used in place of resistances 19 and 20. The current sources maintain an average of the photodetector current. This ensures that the small-signal low cutoff frequency is sufficiently low regardless of input signal. However, for large signal input currents, a string of a few 1's or 0's causes the photodetector node voltages to approach power supply voltages, thus eliminating the input signal to the amplifier. Alternatively, if the bias voltage across detector 12 is reduced, the high-speed operation of optical receiver circuit 10 is compromised. As an example, consider a +2 dBm input signal causing a photodetector current of approximately 2 mA. For coupling capacitors 17 and 18 having a value of 10 pF, the bias voltage across photodetector 12 changes by 0.4 V/nanosecond. Coupling capacitors of only 10 pF in prior art circuits is a severe limitation particularly for sub Gbit/sec data rate applications and also for optical receiver circuits implemented in high-speed very large scale integrated (VLSI) technologies that typically require the use of low power-supply voltages. Thus, much greater capacitor values are needed in prior art circuits.

Certain communication protocols used or anticipated for use with optical fiber and optical receiver circuits have a worse case consecutive string of 1's or 0's which may be as long as 73.

SUMMARY OF THE INVENTION

In accordance with the present invention, an optical receiver for receiving optical signals is described comprising a photodetector having a first and second terminal, the first terminal coupled through a first capacitor to a first input of a transimpedance amplifier, the second terminal coupled through a second capacitor to a second input of the transimpedance amplifier, first means for detecting the voltage on the first terminal and for supplying a first current in response thereto to the first terminal and for supplying a first mirror current, substantially equal to the first current, to the second input of the transimpedance amplifier, second means for detecting the voltage on the second terminal and for removing a second current in response thereto from the second terminal and for removing a second mirror current, from the first input of the transimpedance amplifier, the second mirror current being substantially equal to the second current, a third circuit for detecting the average voltage on the first terminal and for supplying a third current in response to the average voltage on the first terminal to the first input of the transimpedance amplifier, and a fourth circuit for detecting the average voltage on the second terminal and for removing a fourth current in response to the average voltage on the second terminal from the second input of the transimpedance amplifier.

The invention further provides a circuit for coupling the AC component of an input signal across a first and second input terminal to the input of a preamplifier adapted for receiving the input signal comprising a first input terminal coupled through a first capacitor to a first output terminal, a second input terminal coupled through a second capacitor to a second output terminal, a first resistor having one end coupled to the first input terminal and its other end adapted for coupling to a first voltage supply, a second resistor having one end coupled to the second input terminal and its other end adapted for coupling to a second voltage supply, a first circuit for detecting the voltage on the first terminal and for supplying a first current in response thereto the first terminal and for supplying a first mirror current, the first mirror current being substantially equal to the first current, to the second output terminal, a second circuit for detecting the voltage on the second terminal and for removing a second current in response thereto from the second terminal and for removing a second mirror current, substantially equal to the second current, from the first output terminal, a third circuit for detecting the average voltage on the first terminal and for supplying a third current in response to the average voltage on the first terminal to the first output terminal, and a fourth circuit for detecting the average voltage on the second terminal and for removing a fourth current in response to the average voltage on the second terminal from the second output terminal.

BRIEF DESCRIPTION OF THE DRAWING

These and other features, objects, and advantages of the present invention will become apparent upon a consideration of the following detailed description of the invention when read in conjunction with the drawing, in which.

DESCRIPTION OF THE PREFERRED EMBODIMENTS

Figure 2:
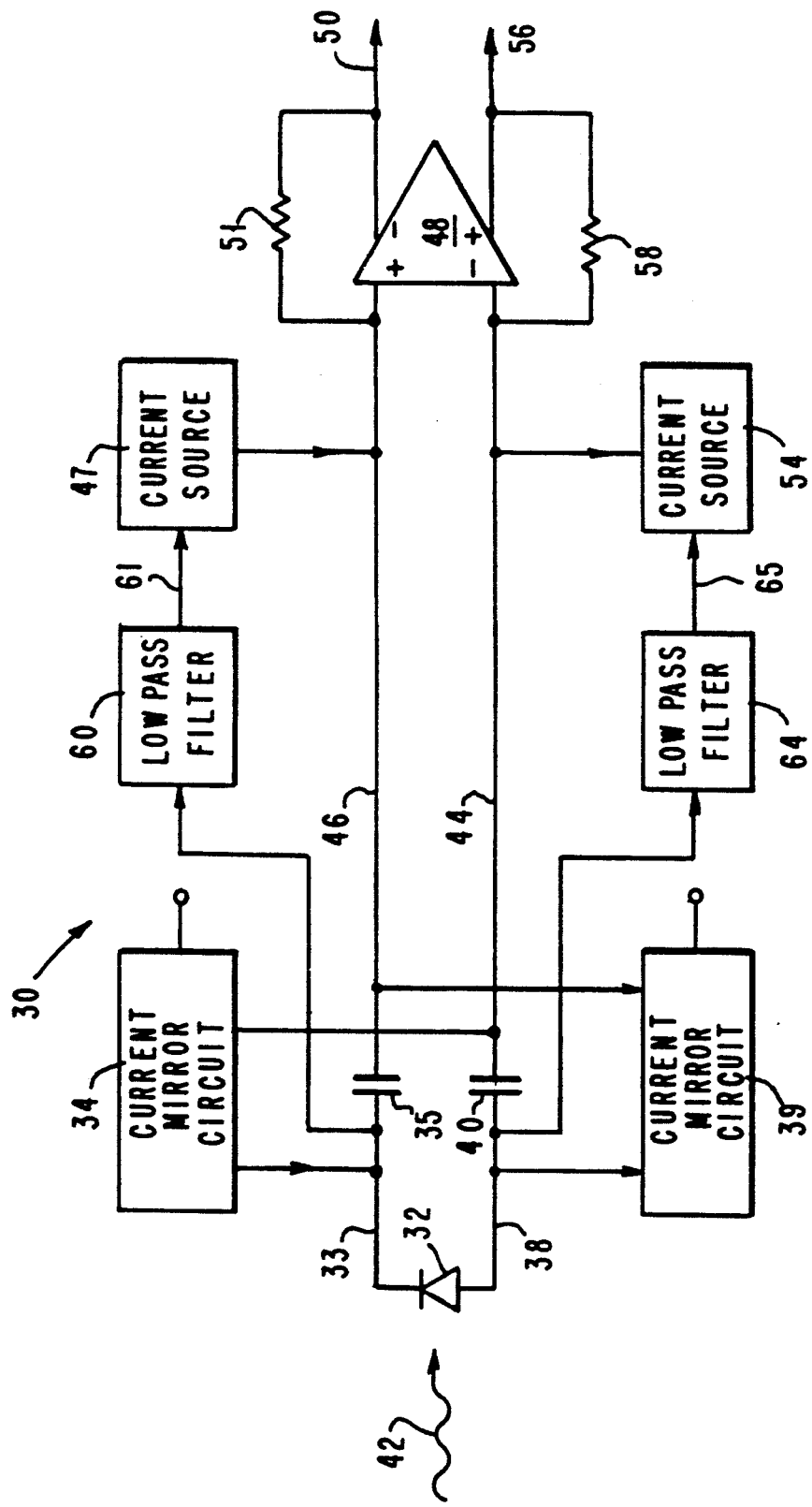
FIG. 2 is one embodiment of the invention.

Referring to the drawing, FIG. 2 shows optical receiver circuit 30. The cathode of photodetector 32 is coupled over lead 33 to a current input of current mirror circuit 34 and to one side of capacitor 35. The anode of photodetector 32 is coupled over lead 38 to a current input of current mirror circuit 39 and to one side of capacitor 40. Photodetector 32 may be a photodiode, for example, a p-type, Intrinsic, n-type (PIN). Photodetector 32 may be positioned to receive radiant energy shown by arrow 42. Current mirror circuit 34 functions to detect the voltage on lead 33 and to supply a first current on lead 33 in response to the detected voltage and for supplying a first mirror current over lead 44 substantially equal to the first current on lead 33 from current mirror circuit 34.

Current mirror circuit 39 functions to detect the voltage on lead 38 and to remove a second current on lead 38 to current mirror circuit 39 in response to the detected voltage on lead 38 and for removing a second mirror current on lead 46 to current mirror circuit 39 substantially equal to the second current. Lead 46 is coupled to the other side of capacitor 35 and to an output from current source 47 and to a + input of amplifier 48. The negative output of amplifier 48 is coupled over lead 50 to the output of optical receiver circuit 30 and through resistor 51 to lead 46. Lead 44 is coupled to an output from current source 54 and to a negative input of amplifier 48. The positive output of amplifier 48 is coupled over lead 56 to the output of optical receiver circuit 30 and through resistor 58 to lead 44.

Lead 33 may be coupled to an input of low pass filter 60 having an output coupled over lead 61 to a control input of current source 47. Low pass filter 60 functions to detect the average voltage on lead 33. Alternatively, low pass filter 60 may detect the fluctuations in current flowing from current mirror circuit 34 to photodetector 32. The output of low pass filter 60 is the average voltage on lead 33 which is coupled to current source 47 to provide a current to lead 46 from current source 47 in response to the average voltage on lead 33. Low pass filter 64 functions to detect the average voltage on lead 38 to provide an output on lead 65 to a control input of current source 54. Current source 54 functions to remove a current from lead 44 in response to the voltage on lead 65.

Figure 1:
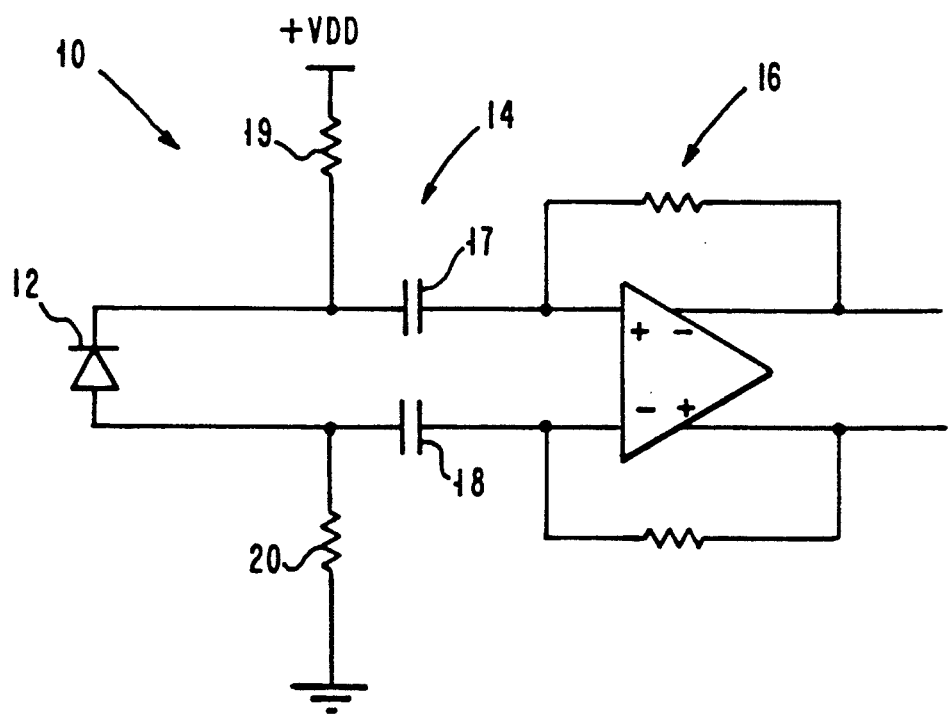
FIG. 1 is an optical receiver circuit of the prior art.

The optical receiver circuit shown in FIG. 2 provides AC coupling between photodetector 32 and transimpedance amplifier 48 where the low cutoff frequency is always sufficiently low regardless of input signal strength from photodetector 32 and where the voltage across photodetector 32 is managed such that high-speed operation of photodetector 32 is maintained. The voltage across photodetector 32 is maintained by a circuit which, for large input signals, limits the voltage swing of photodetector 32. By limiting the voltage swing at photodetector 32, the input current signal is limited which is the AC current coupled through capacitors 35 and 40. The remaining input signal is detected and added to the positive and negative inputs of transimpedance amplifier 48, thus bypassing the AC-coupling capacitors 35 and 40. In this manner, AC-coupling is maintained using a smaller value of coupling capacitance, capacitors 35 and 40, without the problems associated with large input signals and voltage variation at photodetector 32. At the same time, the operation of optical receiver circuit 30 at low input signals is identical to that of a typical optical receiver circuit 10 shown in FIG. 1. Optical receiver circuit 30 has no degradation in sensitivity.

Figure 3:
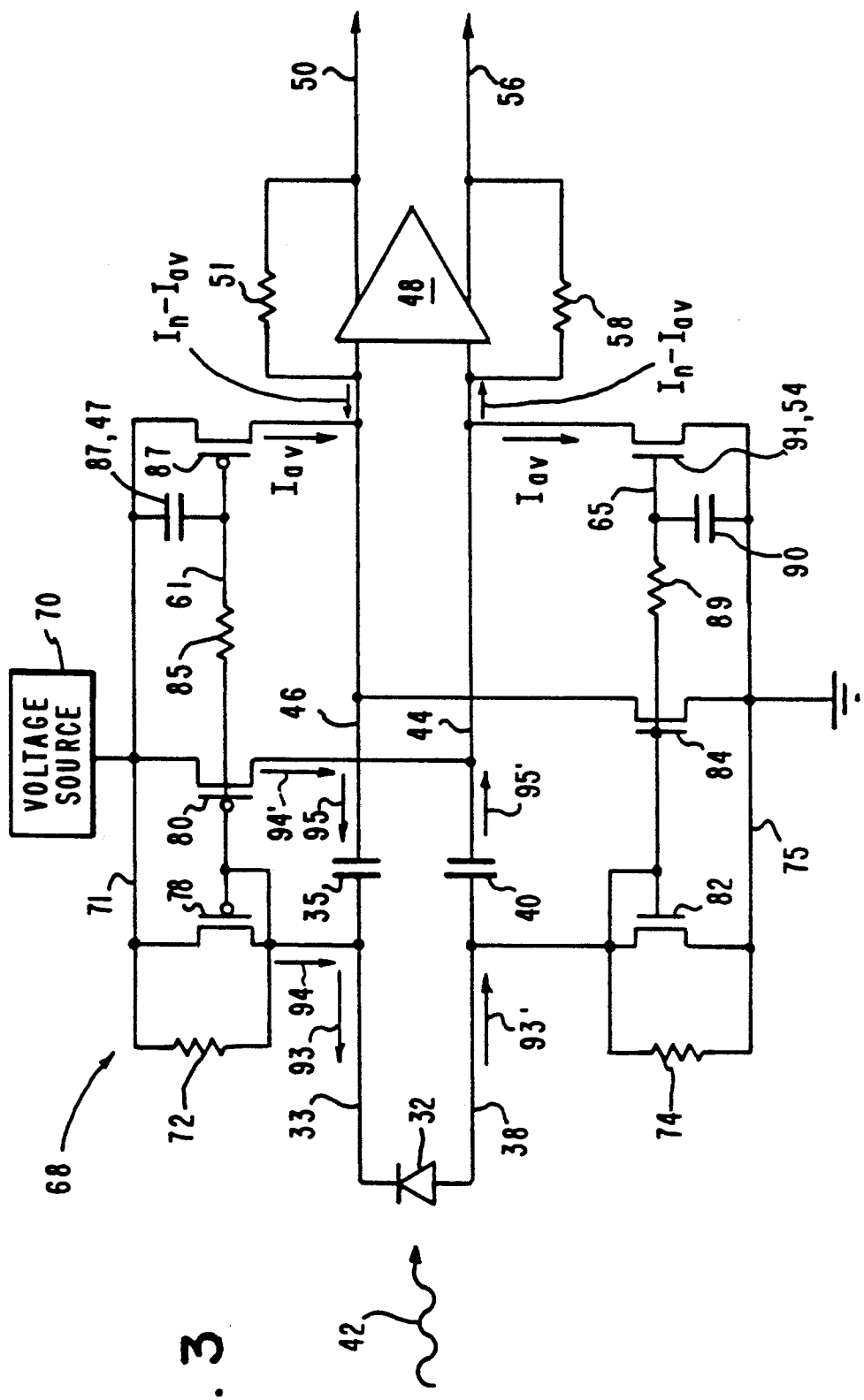
FIG. 3 is a circuit implementation of FIG. 2.

FIG. 3 shows a circuit implementation of FIG. 2. In FIG. 3, like references are used for functions corresponding to the apparatus of FIG. 2. A voltage source 70 which may be, for example, in the range from 3 to 5 volts is coupled over lead 71 through resistor 72 to lead 33. Resistor 72 functions to provide a voltage bias to the cathode of photodetector 32. Lead 38 is coupled through resistor 74 to lead 75 which is coupled to ground potential. Resistor 74 functions to provide a bias voltage to the anode of photodetector 32. Lead 71 is coupled to the source of transistors 78 and 80. The drain of transistor 78 which may be, for example, a P channel MOS transistor is coupled to lead 33 and to the gate of transistors 78 and 80. The drain of transistor 80 is coupled to lead 44. Transistor 80 which may be, for example, a P channel MOS transistor functions to provide a mirror current equal to the current passing through transistor 78.

Lead 38 is coupled to the drain of transistor 82 and to the gates of transistors 82 and 84. Transistors 82 and 84 may form a current mirror circuit where the current through transistor 84 equals the current through transistor 82. Transistors 82 and 84 may be N channel metal oxide semiconductor (MOS) transistors. The source of transistors 82 and 84 are coupled over lead 75 to ground potential. Lead 46 is coupled to the drain of transistor 84. Transistors 82 and 84 form a current mirror circuit such as current mirror circuit 39 in FIG. 2. Transistor 84 functions to conduct the same amount of current as transistor 82. For large input signals on leads 33 and 38, transistors 78 and 82 function to detect the current that is not coupled through capacitors 35 and 40. This current is then mirrored to the input on leads 44 and 46 of amplifier 48 by current mirror transistors 80 and 84.

Lead 33 is coupled through resistor 85 and over lead 61 to one side of capacitor 86 and to the gate of transistor 87. The other side of capacitor 86 is coupled over lead 71 to voltage source 70. Resistor 85 and capacitor 86 function as low pass filter 60 in FIG. 2 and provides the low frequency component of the signal on lead 33 to the gate of transistor 87. Transistor 87 functions as a current source 47 shown in FIG. 2. Transistor 87 functions to remove the DC bias current from transistor 84.

The voltage on lead 38 is coupled through resistor 89 and over lead 65 to one side of capacitor 90 and to the gate of transistor 91. Transistor 91 may be, for example, a N channel MOS transistor. Resistor 89 and capacitor 90 together function as a low pass filter such as low pass filter 64 shown in FIG. 2. Transistor 91 functions as current source 54 shown in FIG. 2. Transistor 91 functions to remove the DC bias current from transistor 80. The low cutoff frequency is determined by the product of resistor 89 and capacitor 90 with respect to transistor 91. Resistor 89 can be made as large as required with no constraints since there is no DC current flow through resistor 89.

From Kirchoff's Law, the input current signal on lead 33 shown by arrow 93 is equal to the current I1 shown by arrow 94 and I2 shown by arrow 95. The average input current is denoted by Iav. In this circuit, the current input from photodetector 32 is I1+I2 shown by arrows 94 and 95 minus Iav. The current input is simply as shown by arrow 93−Iav, which is the input current from photodetector 32 with the DC component subtracted from it.

For a specified input dynamic-range, optical receiver circuit 68 allows the use of significantly smaller coupling capacitors, i.e. capacitors 35 and 40 which then implies a significant reduction in the parasitic bottom-plate capacitance (for monolithic integration in silicon technologies). Reduction in the parasitic bottom-plate capacitance of coupling capacitors 35 and 40 increases the sensitivity and the bandwidth of the AC coupling to and the amplification in amplifier 48.

Figure 4:
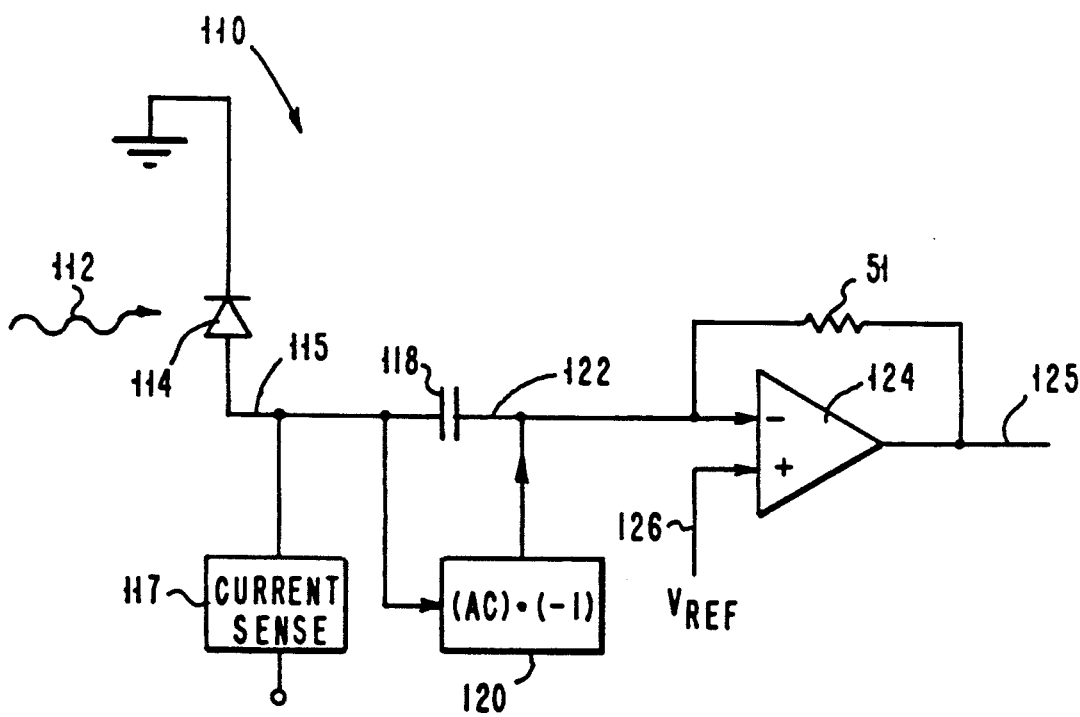
FIG. 4 is a second embodiment of the invention.

Referring to FIG. 4, an optical receiver circuit 110 is shown. Radiant energy shown by arrow 112 impinges upon photodetector 114. The cathode of photodetector 114 is coupled to ground potential. The anode of photodetector 114 is coupled over lead 115 to a bias current source 116, a current source 117, and one side of coupling capacitor 118. For large input signals on lead 115, current source 117 detects the current that is not coupled through coupling capacitor 118. The voltage on lead 115 is coupled to an input of circuit 120. Circuit 120 functions to determine the AC component of the signal on lead 115 and to multiply the AC component by −1 which is then provided as a current over lead 122 to the other side of capacitor 118 and to an input of amplifier 124. Amplifier 124 has an output on lead 125. A second input to amplifier 124 is coupled over lead 126. Lead 126 may be coupled to a reference voltage $V_{ref}$. Amplifier 124 may be, for example, a differential amplifier.

Figure 5:
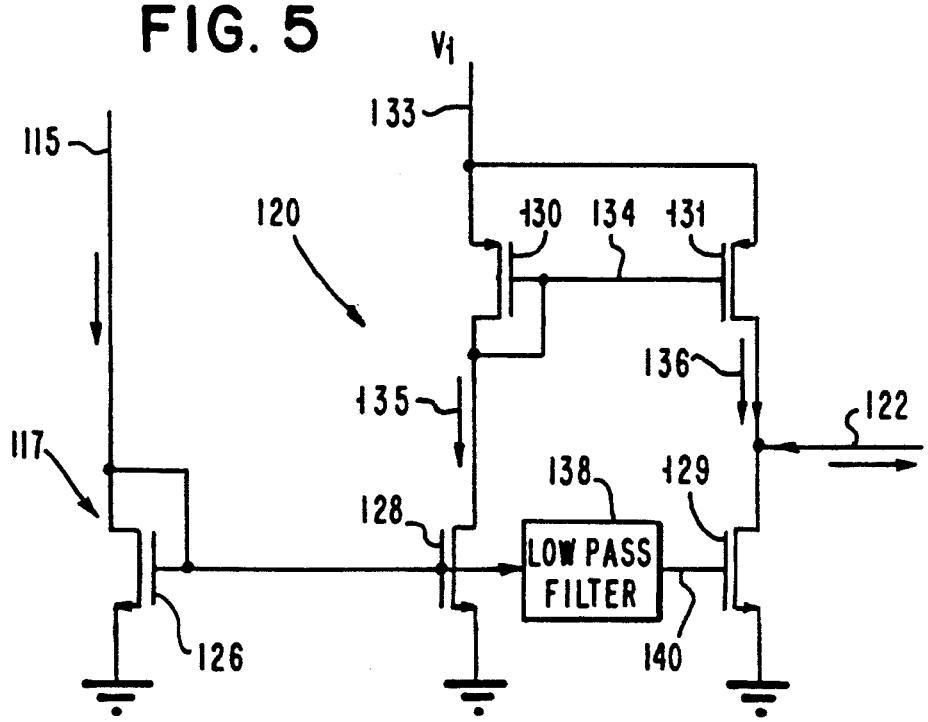
FIG. 5 is a circuit implementation of FIG. 4.

Referring to FIG. 5, a specific embodiment of current source 117 and circuit 120 is shown. Current source 117 may be implemented with transistor 126 having its source coupled to ground potential. The gate and drain of transistor 126 is coupled to lead 115. Transistor 126 may be an N channel MOS transistor.

Circuit 120 may be implemented with transistors 128 through 131. The gate of transistor 128 is coupled to lead 115. The source of transistor 128 is coupled to ground potential. A voltage supply $V_1$ is coupled over lead 133 to the source of transistors 130 and 131. The gate of transistors 130 and 131 are coupled together by way of lead 134 which is also coupled to the drain of transistor 130 and the drain of transistor 128. Transistor 130 functions to supply a current shown by arrow 135 to transistor 128. Transistor 131 functions to supply a mirror current shown by arrow 136 over lead 122 and through transistor 129. The drain of transistors 129 and 131 are coupled together by way of lead 122. Lead 115 is coupled through low pass filter 138 and over lead 140 to the gate of transistor 129. Low pass filter 138 may be, for example, a resistor and capacitor.

An optical receiver for receiving optical signals has been described comprising a photodetector, first and second coupling capacitors coupled between either side of the photodetector and respective inputs of a transimpedance amplifier wherein both inputs are isolated from ground potential, a current mirror circuit for detecting the voltage on a first side of the photodetector and for supplying a first current in response thereto to the first side of the photodetector and for supplying a first mirror current substantially equal to the first current to the second input of the transimpedance amplifier, a second current mirror circuit for detecting the voltage on the second side of the photodetector and for removing a second current in response thereto from the second side of the photodetector and for removing a second mirror current, substantially equal to the second current, from the first input of the transimpedance amplifier, a circuit for detecting the average voltage on the first side of the photodetector and for supplying a third current in response to the average voltage on the first side of the photodetector to the first input of the transimpedance amplifier, and a circuit for detecting the average voltage on the second side of the photodetector and for removing a fourth current in response to the average voltage on the second side of the photodetector from the second input of the transimpedance amplifier.

A second optical receiver for receiving optical signals is described comprising a photodetector having one side coupled to ground, a bias current coupled to a second side of the photodetector, a current source for removing current from the second side of the photodetector as a function of the voltage on the second side of the photodetector, a coupling capacitor for coupling the second side of the photodetector to an input of a transimpedance amplifier, a second input of the transimpedance amplifier coupled to a reference voltage, and a circuit coupled to the second side of the photodetector for sensing the voltage on the second side of the photodetector and supplying a current to the first input of the transimpedance amplifier, the current representative of the AC component of the voltage on the second side of the photodetector.

While there has been described and illustrated an optical receiver for receiving optical signals where both sides of the photodetector may be floating and a second optical receiver for receiving optical signals where one side of the photodetector is tied to a reference voltage such as ground, it will be apparent to those skilled in the art that modifications and variations are possible without deviating from the broad scope of the invention which shall be limited solely by the scope of the claims appended hereto.

Having thus described my invention, what I claim as new and desire to secure by Letters Patents is:

1. An optical receiver circuit for receiving optical signals comprising:
   a photodetector having a first and second terminal,
   said first terminal coupled through a first capacitor to a first input of a transimpedance amplifier,
   said second terminal coupled through a second capacitor to a second input of said transimpedance amplifier, first means for detecting the voltage on said first terminal and for supplying a first current in response thereto to said first terminal and for supplying a first mirror current, substantially equal to said first current, to said second input.

second means for detecting the voltage on said second terminal and for removing a second current in response thereto from said second terminal and for removing a second mirror current, substantially equal to said second current, from said first input, third means for detecting the average voltage on said first terminal and for supplying a third current in response to the average voltage on said first terminal to said first input, and fourth means for detecting the average voltage on said second terminal and for removing a fourth current in response to the average voltage on said second terminal from said second input.

2. The optical receiver circuit of claim 1 wherein said first means includes first and second MOS transistors having their gate electrodes coupled together to said first terminal, and to the drain electrode of said first MOS transistor, the drain electrode of said second MOS transistor coupled to said second input, and the source electrode of said first and second MOS transistors adapted for coupling to a voltage source.

3. The optical receiver circuit of claim 1 wherein said second means includes first and second MOS transistors having their gate electrodes coupled together, to said second terminal, and to the drain electrode of said first MOS transistor, the drain electrode of said second MOS transistor coupled to said first input, and the source electrode of said first and second MOS transistors adapted for coupling to a voltage source.

4. The optical receiver circuit of claim 1 wherein said third means includes said first terminal coupled through a resistor to the gate electrode of a first MOS transistor, a capacitor having a first side coupled to said gate electrode of said first MOS transistor, the source of said first transistor and the second side of said capacitor adapted for coupling to a voltage source, and the drain of said first MOS transistor coupled to said first input.

5. The optical receiver circuit of claim 1 wherein said fourth means includes said second terminal coupled through a resistor to the gate electrode of a first MOS transistor, a capacitor having a first side coupled to said gate electrode of said first MOS transistor and the second side of said capacitor adapted for coupling to a voltage source, and the drain of said first MOS transistor coupled to said first input.

6. The optical receiver circuit of claim 1 wherein said transimpedance amplifier includes a differential amplifier.

7. A circuit for coupling the AC component of an input signal across a first and second input terminal to the input of a preamplifier adapted for receiving said input signal comprising:

said first input terminal coupled through a first capacitor to a first output terminal, said second input terminal coupled through a second capacitor to a second output terminal, a first resistor having one end coupled to said first input terminal and its other end adapted for coupling to a first voltage supply, a second resistor having one end coupled to said second input terminal and its other end adapted for coupling to a second voltage supply, first means for detecting the voltage on said first terminal and for supplying a first current in response thereto to said first terminal and for supplying a first mirror current, substantially equal to said first current, to said second output terminal, second means for detecting the voltage on said second terminal and for removing a second current in response thereto from said second terminal and for removing a second mirror current, substantially equal to said second current, from said first output terminal, third means for detecting the average voltage on said first terminal and for supplying a third current in response to the average voltage on said first terminal to said first output terminal, and fourth means for detecting the average voltage on said second terminal and for removing a fourth current in response to the average voltage on said second terminal from said second output terminal.

8. The circuit of claim 2 further including a photodetector coupled across said first and second input terminals to provide said input signal.

9. The circuit of claim 2 further including a transimpedance amplifier coupled to said first and second output terminals to amplify the signal at said first and second output terminals.

10. An optical receiver circuit for receiving optical signals comprising:

a photodetector having a first and second terminal, said first terminal coupled through a first capacitor in a first input of a transimpedance amplifier, said second terminal adapted for coupling to a voltage source, first means for detecting the voltage on said first terminal and for removing a first current in response thereto from said first terminal, and second means for detecting the voltage on said first terminal and for supplying a second current to said first input indicative of the AC component of said voltage on said first terminal whereby the output of said transimpedance amplifier provides a signal indicative of the AC voltage on said first terminal.

11. The optical receiver circuit of claim 10 wherein said second means includes a first current mirror circuit for generating a first mirror current, substantially equal to said first current, a second current mirror circuit for generating a second mirror current, substantially equal to said first mirror current, to said first input, and third means for detecting the average voltage on said first terminal and for removing a third current in response to the average voltage on said first terminal from said first input.

* * * * *